United States Patent
Rebel

(10) Patent No.: US 7,109,803 B2
(45) Date of Patent: Sep. 19, 2006

(54) METHOD AND CIRCUIT ARRANGEMENT FOR SYNCHRONIZING PLURAL OSCILLATORS

(75) Inventor: Reimund Rebel, Ringwood, NJ (US)

(73) Assignee: ATMEL Germany GmbH, Heilbronn (DE)

( * ) Notice: Subject to any disclaimer, the term of this patent is extended or adjusted under 35 U.S.C. 154(b) by 50 days.

(21) Appl. No.: 10/988,315

(22) Filed: Nov. 12, 2004

(65) Prior Publication Data

US 2005/0104666 A1 May 19, 2005

(30) Foreign Application Priority Data

Nov. 14, 2003 (DE) ................ 103 54 521

(51) Int. Cl.
*H03L 7/07* (2006.01)
*H04B 1/06* (2006.01)
(52) U.S. Cl. .................. 331/2; 331/25; 455/260
(58) Field of Classification Search ........ 331/2, 331/10, 11, 14, 16, 18, 25, 34, 172–173; 455/260, 269, 272–273, 275, 276.1, 277.1, 455/277.2, 278.1

See application file for complete search history.

(56) References Cited

U.S. PATENT DOCUMENTS 5,717,730 A 2/1998 Prakash et al.
6,281,727 B1 * 8/2001 Hattori ................ 327/156

FOREIGN PATENT DOCUMENTS

DE 22 40 729 2/1974
DE 37 20 682 1/1989
DE 42 36 621 5/1994

* cited by examiner

*Primary Examiner*—David Mis
(74) *Attorney, Agent, or Firm*—W. F. Fasse; W. G. Fasse

(57) ABSTRACT

A circuit arrangement includes a first phase locked loop to generate a first oscillator frequency, a second phase locked loop to generate a second oscillator frequency, a reference frequency emitter connected to a reference frequency input of both phase locked loops, and a signal attenuator and optionally a switch connected between a master signal output of the first (master) loop and an input of the second (slave) loop. In a method, a common reference frequency is provided to both loops, the first loop generates a first oscillator frequency, and the second loop generates a second oscillator frequency that matches the first oscillator frequency in at least one operating mode and optionally differs from the first oscillator frequency in another operating mode. The frequency matching in one of the modes involves feeding an attenuated signal from the first loop operating as a master into the second loop operating as a slave.

27 Claims, 4 Drawing Sheets

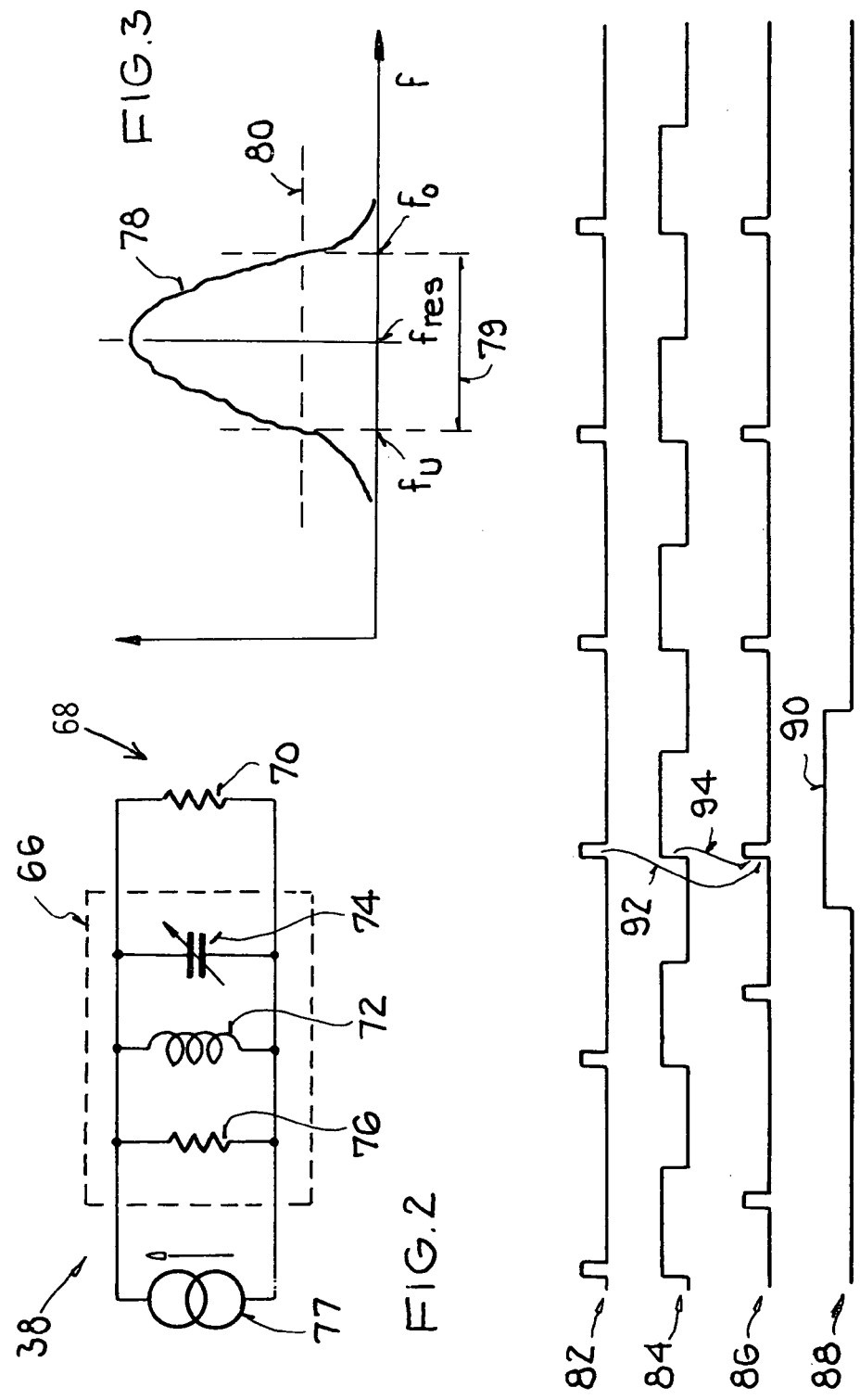

METHOD AND CIRCUIT ARRANGEMENT FOR SYNCHRONIZING PLURAL OSCILLATORS

PRIORITY CLAIM

This application is based on and claims the priority under 35 U.S.C. §119 of German Patent Application 103 54 521.2, filed on Nov. 14, 2003, the entire disclosure of which is incorporated herein by reference.

FIELD OF THE INVENTION

The invention relates to both a method and a circuit arrangement for generating a first oscillator frequency with a first phase locked loop and a second oscillator frequency with a second phase locked loop, wherein the second oscillator frequency may be matched to the first oscillator frequency.

BACKGROUND INFORMATION

Various methods and a circuit arrangements of the above mentioned general type are conventionally known. Such methods and circuit arrangements are utilized, for example, in the field of mobile reception of radio signals, such as in modern automobile radios, whereby various specific techniques are used, in order to ensure an uninterrupted and interference-free reception of the radio signals even under continually changing reception conditions.

A first example of the above mentioned techniques is given by the Radio Data System (RDS), which provides for the transmission of information indicating an alternative frequency on which the same radio program can be received if there is interference on the primary frequency. Based on this information indicating one or more alternative frequencies, the receiver can monitor and evaluate the reception quality available on the various alternative frequencies, and then select the best frequency, i.e. the frequency with the best reception quality, for carrying out the further signal reception. In that context, it is advantageous to provide and operate not only a first receiver (the audio receiver) but also an additional second receiver (a background receiver) that runs in the background in order to monitor and test or evaluate the reception quality of the available alternative frequencies on an ongoing basis. If such a background receiver indicates an alternative frequency having a better reception quality than the frequency presently being used by the audio receiver, then the audio receiver is switched over to this better alternative frequency. As a further possibility, the respective roles of the audio receiver and the background receiver are switched, namely the receiver previously operating as the background receiver will now operate as the audio receiver on the alternative frequency having the better reception quality, while the previous audio receiver will then operate as the background receiver on the other frequency or frequencies.

Continuously varying or changing reception conditions are also the cause of so-called multi-path interferences. This term applies to interference that arises from the superposition of signal components reaching the receiver antenna via a direct path with other signal components that reach the antenna via other indirect paths, e.g. due to reflections, and thus exhibit a phase shift. For example, such reflections arise on large buildings and the like. The overall signal arriving at the antenna thus includes multiple signal components that have reached the antenna by different paths, e.g. due to different interposed reflections, and thus have different phase shifts relative to each other. Due to such multi-path interference, the reception can vary very strongly or drastically over very small spatial distances due to the differing superposition of the various phase-shifted radio signal components. Thus, as the receiving antenna moves, the overall received signal will fluctuate or vary drastically. In this context, a second example of the above mentioned techniques comes into play, particularly with a so-called antenna diversity system. Such a system is characterized by providing plural antennas, and selecting a respective active antenna among the available antennas at any time based on the signal reception quality of the respective antenna.

A combination of the above two techniques is given, for example, by an arrangement including plural separate antennas and plural separate audio and background receivers, which are respectively coupled with their own antennas. In such an arrangement or configuration, the special requirement arises, that the various receivers must operate completely independently of one another in a first operating mode or condition, but must operate on the same frequency in a second operating mode or condition. For example, in the first operating mode, one receiver operates on the audio frequency that has been selected for the superior reception quality thereof, while the other receiver operates as the background receiver and periodically tests the reception quality available on the various alternative frequencies.

Moreover, in principle it is possible to operate plural receivers on the same frequency, and to increase the signal reception sensitivity of the overall system through the phase-correct addition of the several signals or signal components received respectively by several antennas of the overall system. This increase of the sensitivity can be achieved because the noise signals arise in an uncorrelated manner via the several antennas, while the useful signal (e.g. the audio signal that is to be received) arises in a correlated manner via the several antennas. Through appropriate phase shifting of the added signals, a directional effect of the overall antenna system can be achieved.

In typical conventional signal superimposing receivers, e.g. heterodyne receivers, a high frequency reception signal is superimposed or mixed with an oscillator signal so as to be mixed down to an intermediate frequency. In this context, it is problematic that the respective local oscillators of the various receivers must be very strongly decoupled from one another in order to avoid mutual influence therebetween. In generally known conventional methods and circuit arrangements, various different local oscillators are synchronized on a common reference frequency, and it is attempted to decouple the local oscillators from one another. However, phase noise of the oscillators as well as noise components of the phase locked loops prevent a complete or perfect synchronization of the oscillators when all of the oscillators are to operate on the same frequency. Moreover, an incomplete decoupling of the oscillators relative to one another leads to a mutual or interactive influence therebetween, which is noticeable as interfering noise in the receiver.

Alternatively, a synchronization can also be achieved in that one receiver distributes the signal of its oscillator to the other receivers. The local oscillators of the other receivers are then switched off, because the other receivers will instead use the oscillator signal provided by the first or master receiver. This alternative, however, requires relatively complicated and expensive high frequency switches, in order to ensure an adequate or sufficiently high decoupling in the switched-off condition. Since a tuning voltage from the phase locked loop of a local oscillator is used for adjusting or tuning subsequent or following filter circuits of the receiver, for this purpose the tuning voltage from the phase locked loop of the active local oscillator must also be delivered further on to the other receivers, which is complicated with respect to the necessary circuit arrangements therefor. Moreover, the tuning adjustment or balancing of the individual receivers is complicated, since an adjustment or balancing of the filter circuits is based on the control voltage of the oscillator (e.g. voltage controlled oscillator VCO). Thus, the tuning adjustment or balancing must occur in the entire or overall system, when both voltage controlled oscillators (both the internal and external master oscillator) are present. In this regard, the filter balancing is further made more difficult if the individual receivers are respectively subjected to different surrounding environmental temperatures, such that the several receivers will exhibit different temperature-dependent characteristic behaviors.

SUMMARY OF THE INVENTION

In view of the above, it is an object of the present invention to provide a method and an apparatus for synchronizing plural oscillators, through the use of a simple and economical circuit technology and a simple or uncomplicated filter tuning or balancing. The invention further aims to avoid or overcome the disadvantages of the prior art, and to achieve additional advantages, as apparent from the present specification. The attainment of these objects is, however, not a required limitation of the claimed invention.

The above objects have been achieved according to the invention in a method for generating a first oscillator frequency with a first phase locked loop and generating at least a second oscillator frequency with at least one second phase locked loop, wherein one and the same reference frequency, i.e. a single common reference frequency, is provided to both the first and the second phase locked loop. The second oscillator frequency is matched to the first oscillator frequency in at least one operating mode. Optionally, the second oscillator frequency differs or deviates from the first oscillator frequency in at least one other operating mode. Further particularly according to the invention, the tuning or matching of the second oscillator frequency to the first oscillator frequency in at least one operating mode comprises a step of feeding an attenuated signal out of the first phase locked loop into the at least one second phase locked loop.

The above objects have further been achieved according to the invention in a circuit arrangement that is suitable for carrying out the inventive method. This circuit arrangement comprises a first phase locked loop adapted to generate a first oscillator frequency, at least one second phase locked loop adapted to generate at least one second oscillator frequency, a single reference frequency emitter having a reference frequency output connected in common to respective reference frequency inputs of both the first phase locked loop and the at least one second phase locked loop, and a circuit connection including an attenuator connected between the first phase locked loop and the at least one second phase locked loop and adapted to feed an attenuated signal out of the first phase locked loop into the at least one second phase locked loop. Thereby, the circuit arrangement is adapted to match the second oscillator frequency to the first oscillator frequency in at least one operating mode of the circuit arrangement.

While the attenuated signal out of the first phase locked loop is being fed into the second phase locked loop, the first phase locked loop acts as a master and the second phase locked loop acts as a slave. In this operating mode or condition, the second phase locked loop operates as a resonance amplifier, which amplifies, in a phase-correct or matched manner, the weak injected signal of the first phase locked loop. Thereby it is ensured that both phase locked loops and their respective local oscillators will operate with the same frequency, namely the frequency specified by the attenuated signal provided from the first phase locked loop and particularly the local oscillator of the first phase locked loop.

It is preferred in one embodiment that a frequency divider of the at least one second phase locked loop is synchronized with a frequency divider of the first phase locked loop. This is preferably achieved by means of a setting device or synchronizer, which synchronizes the frequency divider of the second phase locked loop with the frequency divider of the first phase locked loop. This embodiment excludes the possibility of a phase shift that could otherwise possibly arise between the injected signal from the first phase locked loop and the output signal of the second phase locked loop.

According to a further preferred embodiment of the invention, a frequency divider of the at least one second phase locked loop is synchronized with the reference frequency. This embodiment is also preferably realized through the use of a setting device or synchronizer, which synchronizes a frequency divider of the at least one second phase locked loop with the reference frequency. This embodiment represents an alternative manner of excluding or avoiding a phase shift between the injected signal and the output signal of the second phase locked loop.

It is further preferred that the first oscillator frequency is superimposed on a reception spectrum in a first heterodyne receiver, and thereby transforms or converts a first reception frequency to an intermediate frequency. Similarly, at least one second oscillator frequency is preferably superimposed on the reception spectrum in at least one second heterodyne receiver and thereby transforms or converts at least one second reception frequency to an intermediate frequency. A corresponding circuit arrangement preferably comprises a first heterodyne receiver with a first mixer that superimposes or mixes the first oscillator frequency with a reception spectrum and thereby transforms the first reception frequency to an intermediate frequency. This circuit arrangement additionally comprises a second heterodyne receiver with a second mixer that superimposes or mixes a second oscillator frequency with the reception spectrum and thereby transforms the second reception frequency to an intermediate frequency. Through these embodiments, the reception quality is significantly improved in the mobile reception of radio signals, for example in modern automobile radios. As a result, audible fluctuations of the reception quality are reduced, even under continuously varying or changing reception conditions.

A further preferred feature is that at least two heterodyne receivers are coupled with respective antennas that are separated from one another. Such a coupling of an antenna diversity arrangement with a receiver or tuner diversity arrangement combines the advantages of tuner diversity with the advantages of antenna diversity. For example, antenna diversity is especially suitable for compensating and thus overcoming or avoiding multi-path interferences. In this context, the plural receivers can all operate on the same frequency.

A further preferred embodiment is characterized by a mixer that superimposes, in a phase-accurate and additive manner, the respective signals of plural antennas that are separated from one another, either before or after a signal processing of these signals. Thereby, namely through the phase-accurate or phase-correct addition of the signals respectively received via different antennas, the total sensitivity of the overall system is increased.

The circuit arrangement preferably further comprises a controllable phase shifter that achieves a controllable phase shifting between the signals that are to be superimposed. Through such a phase shifting of the added signals, a directional effect of the total antenna system is achieved.

It is still further preferred that the circuit arrangement comprises at least one further heterodyne receiver with a further mixer, which superimposes or mixes a further oscillator frequency with a reception spectrum and thereby transforms a further reception frequency to an intermediate frequency and which is driven or operated with the first oscillator frequency in a second operating mode. This embodiment makes it possible, for example, to simultaneously test plural alternative frequencies or to sequentially sample plural alternative frequencies, while other antennas are driven with a common frequency in order to achieve a directional effect.

It should be understood that the embodiments, features and advantages of the invention described above and to be described below are not limited to the particular combinations as described, but instead can also be used in other combinations or individually while still remaining within the scope of the present invention.

BRIEF DESCRIPTION OF THE DRAWINGS

In order that the invention may be clearly understood, it will now be described in connection with example embodiments thereof, with reference to the accompanying drawings, wherein:

FIG. 2 is a basic equivalent circuit diagram of a voltage controlled oscillator with an input feed of an attenuated signal, to be used, for example, in the embodiment according to FIG. 1;

FIG. 3 is a graphical diagram of the course or curve of the amplitude of a signal output by the voltage controlled oscillator according to FIG. 2 over the frequency of the attenuated excitation signal being fed into the oscillator;

FIGS. 4A, 4B, 4C, and 4D respectively show the time course of four signals in connection with a synchronization of two phase locked loops;

DETAILED DESCRIPTION OF A PREFERRED EXAMPLE EMBODIMENT AND OF THE BEST MODE OF THE INVENTION

Figure 1:
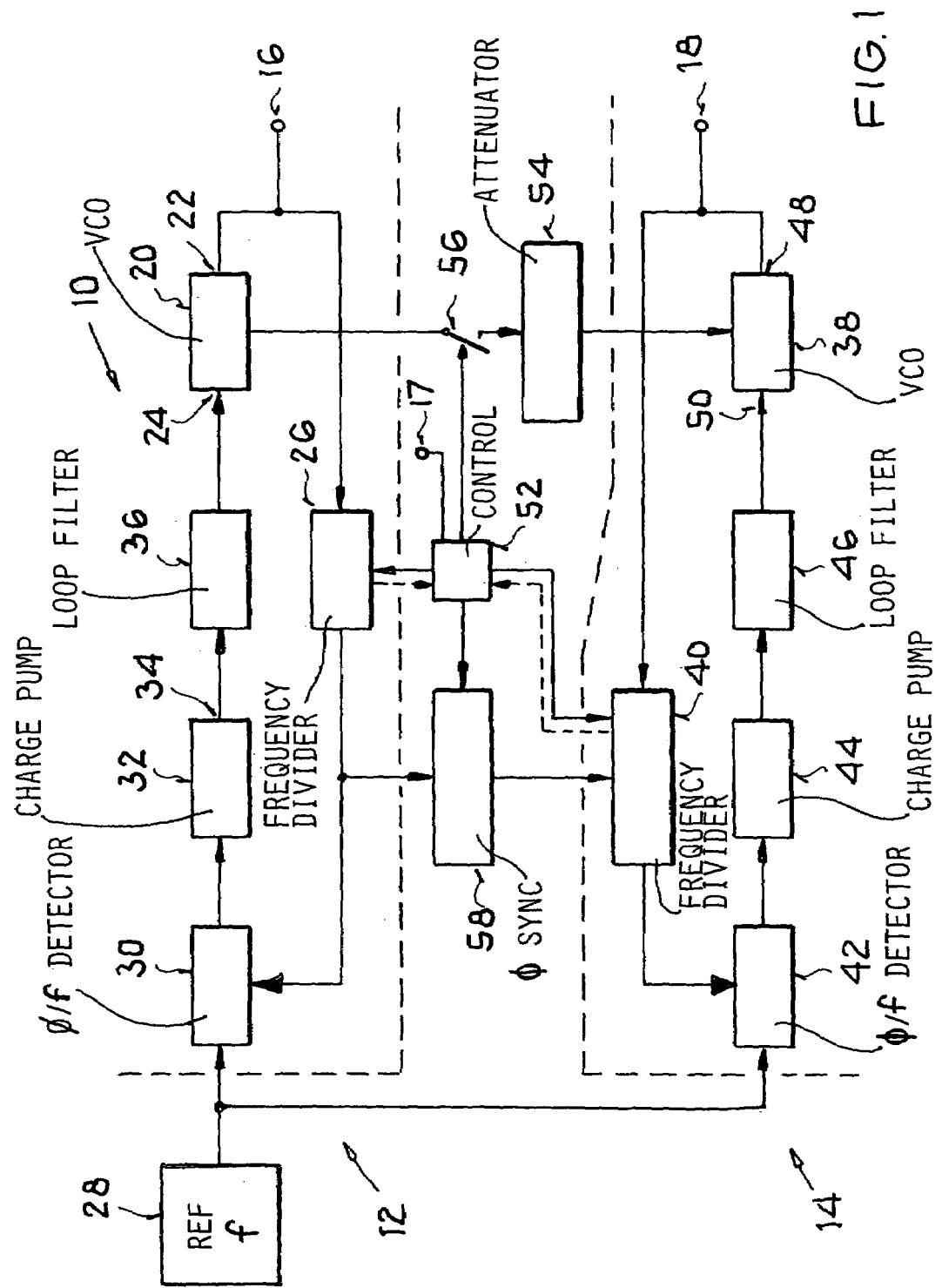
FIG. 1 is a schematic functional block diagram showing the general functional block structure of a first example embodiment of the invention.

FIG. 1 schematically shows the overall construction of a circuit arrangement 10 according to the invention, having a first phase locked loop 12 that provides a first oscillator frequency at a first output 16 of the arrangement 10, and a second phase locked loop 14 that provides a second oscillator frequency at a second output 18 of the arrangement 10. The first phase locked loop 12 comprises a first oscillator 20, for example embodied as a voltage controlled oscillator (VCO) 20. At its output 22, the first oscillator 20 provides an alternating voltage signal having a frequency (i.e. the first oscillator frequency) that is dependent on the value of a control voltage that is provided to an input 24 of the first oscillator 20. The alternating voltage signal of the first oscillator 20 is provided to the first output 16, and is further provided to a first controllable frequency divider 26, by which the frequency of the alternating voltage signal is divided down to the level of a reference frequency provided by a reference frequency emitter 28.

Both the reference frequency provided by the reference frequency emitter 28 as well as the divided frequency of the first oscillator 20 as output by the first controllable frequency divider 26 are respectively provided to a first phase/frequency detector 30, where these two frequencies are compared with one another. The first phase/frequency detector 30 produces an output signal whenever the frequency and/or phase angles of the two signals input to the detector differ from one another. Depending on whether the signal transitions or flanks of the divided VCO signal provided through the frequency divider 26 lead ahead of or lag behind the transitions or flanks of the reference signal provided by the reference frequency emitter 28, the phase/frequency detector 30 will correspondingly produce control signals having respective opposite signs (plus and minus, or up and down). This control signal output by the phase/frequency detector 30 is provided to a charge pump 32, which correspondingly charges or discharges a capacitor, for example, in response to and dependent on the control signals. The voltage of this capacitor is provided via an output 34 of the charge pump 32 through a first loop filter 36, which smooths this voltage to produce a control voltage that is provided to the control input 24 of the first voltage controlled oscillator 20.

The second phase locked loop 14 has an analogous structure as the first phase locked loop 12. Thus, the second phase locked loop 14 comprises a second oscillator 38, a second controllable frequency divider 40, a second phase/frequency detector 42, a second charge pump 44, and a second loop filter 46 connected in sequence to form the loop. The second oscillator 38 produces an alternating voltage signal (with the second oscillator frequency) at its output 48, which is provided to the second output 18 and to the second frequency divider 40. The frequency of this alternating voltage signal is dependent on the magnitude of the control voltage provided to the control input 50 of the second oscillator 38 from the second loop filter 46.

The circuit arrangement 10 further comprises a controller 52 with an external input 17, an attenuating device or attenuator 54, a switch 56, and a phase synchronization device or phase synchronizer 58. The controller 52, for example, adjusts or sets the divider ratios for the controllable frequency dividers 26 and 40 by suitable control signals provided thereto, and thereby controls a synchronization of the two frequency dividers 26 and 40. Such a synchronization is triggered when the circuit arrangement 10 is to be set into the corresponding synchronized operating mode, by a super-ordinated controller (not shown) that applies a trigger signal to the external input 17 of the circuit controller 52.

The phase locked loops 12 and 14 run or operate independently of one another, as long as their respective frequency dividers 26 and 40 are set to different frequencies. The circuit controller 52 controls the switch 56, the phase synchronizer 58, and the two frequency dividers 26 and 40. Under certain circumstances it can be advantageous if the divider 26 and/or the divider 40 provide a return signal back to the circuit controller 52, as indicated by the dashed line arrows extending from the divider blocks 26 and 40 back to the circuit controller 52 in FIG. 1. From these optional return signals, the circuit controller 52 can detect and recognize the current actual existing condition or state of the respective frequency dividers 26 and 40 and accordingly wait for the correct time window.

If both phase locked loops 12 and 14 are to provide equal frequencies at their respective outputs 16 and 18, then the circuit controller 52 adjusts both frequency dividers 26 and 40 to the same nominal or desired frequency. Additionally, the circuit controller 52 closes the switch 56, which thereby feeds an attenuated signal of the first oscillator 20 into the second phase locked loop 14. The signal of the first oscillator 20 in this context is attenuated by a signal attenuating device or attenuator 54 that is connected in series with the switch 56 between the first oscillator 20 and the second oscillator 38. The attenuator 54 may be embodied simply as an ohmic resistance or resistor. The signal of the first oscillator 20 that is to be attenuated and fed to the second oscillator 38 can be the alternating voltage signal provided at the output 22 of the first oscillator 20 or a different signal derived therefrom.

As long as the frequency of the second phase locked loop 14 deviates strongly or sharply from the nominal or desired frequency, then the second phase locked loop 14 operates in a normal operating mode, in which its voltage controlled oscillator 38 gradually and progressively "pulls-in" or transiently oscillates toward and then locks-in to the nominal desired frequency. When the frequency of the second phase locked loop 14 approaches the frequency of the first phase locked loop 12, then the second phase locked loop 14 will synchronize itself to the frequency of the first phase locked loop 12 due to non-linear effects in the oscillator 38 of the second phase locked loop 14. In this operating mode, the second phase locked loop 14 operates as a resonance amplifier and amplifies the attenuated injected signal of the first oscillator 20. In this manner it is ensured that both oscillators 20 and 38 run synchronously with the same frequency.

If the frequency of the injected signal deviates from the resonance frequency of the second phase locked loop 14, then a phase shift will arise between the injected signal and the output signal of the second phase locked loop 14. This phase shift is removed or set to a prescribed value by the phase synchronizer 58, which is also operated and controlled by the circuit controller 52.

It should be understood that the individual blocks shown in FIG. 1 respectively have certain functions allocated thereto as described above. Thus, each block can concretely be embodied or comprised of one or more circuit elements which may have any conventionally known construction and arrangement for achieving the respective described function. The functional blocks of FIG. 1 can also be understood as representing individual steps of a method according to the invention, whereby all of the blocks shown in FIG. 1 together represent an example embodiment of the overall method. Analogous considerations apply to the subject matter of FIGS. 5 and 6.

FIG. 2 shows an equivalent circuit diagram of the basic functional or circuit elements making-up the second voltage controlled oscillator 38 having an input feed of an attenuated signal from the first oscillator 20 as described above in connection with FIG. 1. The oscillator 38 generally comprises a passive resonant circuit 66 and an active oscillator circuit 68, which, in an idealized case, can be represented simply by an amplitude-dependent negative resistance 70. In this regard, a negative resistance is understood to refer to any circuit with a linear current-voltage characteristic, which does not dissipate energy, but rather provides energy upon the application of a voltage thereto. Thus, in effect, this functions as a negative resistance value. On the other hand, the passive resonator or resonant circuit 66 may, for example, be constructed as a parallel oscillating circuit of an inductance (or concretely an inductor) 72 and a capacitance (or concretely a capacitor) 74, which is damped by a damping resistance (or concretely a damping resistor) 76.

If the negative resistance 70 over-compensates the positive resistance of the damping resistor 76, then an exponentially increasing oscillation will arise at the resonance frequency in the resonant circuit 66, whereby this oscillation is excited by the inherent internal noise of the circuit. The amplitude of this oscillation will continue to increase until the magnitude of the negative resistance value of the negative oscillator resistance 70 has adjusted itself (along its e.g. linear characteristic) to the positive damping resistor 76. Thereafter, the oscillation amplitude will remain constant. Furthermore, in FIG. 2, the alternating voltage source 77 equivalently represents the excitation of the oscillator 38 by an attenuated signal that is coupled out of the first phase locked loop 12 and into the second phase locked loop 14, for example via the switch 56 and attenuator 54 as described above in connection with FIG. 1.

FIG. 3 shows a theoretical curve 78 of the output voltage V of the second oscillator 38 with respect to, i.e. as a function of, the excitation frequency f, as the output voltage V would arise for a constant amplitude of the attenuated input feed signal and with a linear superposition of the signals. A frequency capture or pull-in range 79 of the oscillator 38 is defined between the two frequencies $f_u$ and $f_{of}$. Between these two limit frequencies, the amplitude of the output voltage V is greater than an oscillation amplitude 80 of the free-oscillating or free-running oscillator 38. In other words, in this frequency capture or pull-in range 79, the value of the amplitude-dependent negative resistance 70 is greater than the resistance value of the resonance damping resistor 76, which has as a result, that the inherent self-oscillation is suppressed. It can be easily recognized that the frequency capture or pull-in range 79 becomes larger as the amplitude of the injected attenuated signal increases. In the opposite sense, a signal that lies close to the resonance frequency $f_{res}$ can bring about the same effect with a very small amplitude that lies only slightly above the noise level. These circumstances make it nearly impossible to decouple the oscillators 20 and 38 without the use of a controllable switch 56.

If the frequency of the injected signal deviates from the resonance frequency of the second phase locked loop 14, then a phase shift will arise between the injected signal and the output signal of the second oscillator 38. In order to ensure that both frequency dividers 26 and 40 are in phase, the second controllable frequency divider 40 of the second phase locked loop 14 must be synchronized with the first controllable frequency divider 26 of the fist phase locked loop 12. Various different possibilities for achieving such synchronization will be discussed in further detail below with reference to FIG. 4 including FIGS. 4A, 4B, 4C and 4D.

FIG. 4A shows an output signal 82 of the first controllable frequency divider 26. Corresponding thereto, FIG. 4B shows an output signal 84 of the reference frequency emitter 28, and FIG. 4C shows an output signal 86 of the second controllable frequency divider 40. FIG. 4D shows a control signal 88 output by the circuit controller 52 to the phase synchronizer 58 in order to carry out a synchronization as mentioned above. Note that FIGS. 4A to 4D show the respective time progressions of the signals 82, 84, 86 and 88, aligned with one another in time. In this example embodiment, the synchronization is carried out upon the occurrence of a high signal level 90 of the control signal 88 shown in FIG. 4D.

For example, the synchronization can be achieved through a one-time resetting of the second controllable frequency divider 40 having the output signal 86, after the occurrence of the high signal level 90, synchronously to the output signal 82 of the first frequency divider 26. This is represented by the arrow 92 showing the synchronization of a pulse of the signal 86 with a pulse of the signal 82 falling within the range of the high signal level 90. In other words, while the pulses of the signals 82 and 86 are not synchronized with one another before the occurrence of the high signal level 90 of the control signal 88, once the high signal level 90 occurs, the second frequency divider is reset and restarted so that its output 86 will have its pulses synchronized to the pulses of the output signal 82 of the first frequency divider 26 thereafter.

Alternatively, a synchronization timing or reset information could be taken from the output signal 84 of the reference frequency emitter 28, as indicated by the arrow 94. In other words, in this alternative, the second frequency divider 40 is reset and restarted so that its output signal 86 becomes synchronized to the cycles of the output signal 84 of the reference frequency emitter 28 once the high signal level 90 of the control signal 88 occurs. This alternative can especially be used in the steady-state or settled oscillating condition of the first phase locked loop 12.

It should further be understood that, instead of a resetting or synchronizing to the same time point (without any phase shift or offset), it is alternatively possible to reset or synchronize to a respective time point exhibiting a prescribed phase shift between the signals 86 and 82 or the signals 86 and 84. In other words, while FIGS. 4A to 4D show a phase-matched synchronization, it is alternatively possible to provide a phase-offset or phase-shifted synchronization.

The first embodiment of the synchronization between the signals 82 and 86, as represented by the arrow 92 between FIGS. 4A and 4C, is realized through the subject matter of FIG. 1, especially the connection of the synchronizer 58, as described above. On the other hand, the second embodiment of the synchronization between the signals 84 and 86, as represented by the arrow 94 between FIGS. 4B and 4C, is realized through the subject matter of FIG. 5, especially the connection of the synchronizer 58, to be described next.

Figure 5:
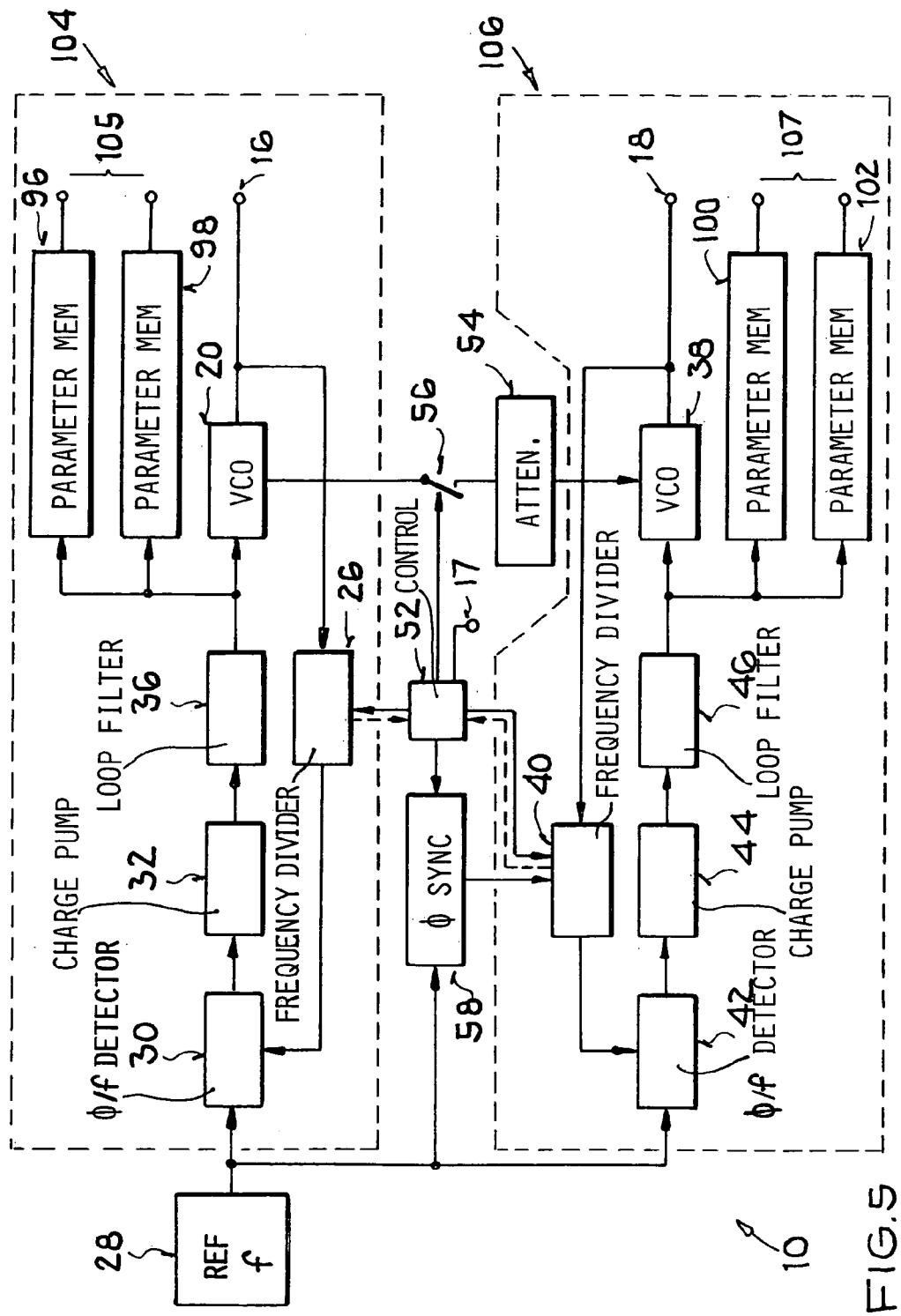
FIG. 5 is a schematic functional block diagram showing the general functional block structure of a second example embodiment of the invention.

In this regard, FIG. 5 represents an alternative example embodiment of a functional block structure according to the invention. While the embodiment of FIG. 5 shares much of the subject matter of FIG. 1, whereby corresponding elements are labeled with the same reference numbers and a redundant description thereof is omitted here, the embodiment of FIG. 5 further includes additional elements or features as follows. Particularly, the embodiment according to FIG. 5 differs from that of FIG. 1 through the addition of functional blocks 96 and 98 allocated to the first phase locked loop 12, and functional blocks 100 and 102 allocated to the second phase locked loop 14. Also, in this embodiment of FIG. 5, the phase synchronizer 58 is connected between the reference frequency emitter 28 and the second frequency divider 40, so as to synchronize this second frequency divider 40 with the reference frequency, rather than directly with the output of the first frequency divider 26, as was the case in the embodiment of FIG. 1.

In this example embodiment, the blocks 96 and 98 represent characteristic parameter fields, or concretely memory elements storing fields of characteristic values or parameters, which are addressed with the tuning voltage of the first oscillator 20 from the first phase locked loop 12, and in which tuning voltages for various tuning circuits in a first receiver 104 are stored as functions of parameters x, $p_{m1}$, $p_{m2}$, ... $p_{mn}$. These parameters are essentially dependent on the tolerances of the particular circuit elements or components being used in the circuit. The tuning voltages of the first receiver 104 are provided via outputs 105 of the characteristic value memories 96 and 98 for the further processing of these tuning voltages in subsequent filter circuits or stages.

Analogously, the blocks 100 and 102 can represent characteristic parameter fields, or concretely memory elements storing fields of characteristic values or parameters, which are addressed with the tuning voltage of the second voltage controlled oscillator 38 of the second phase locked loop 14, and in which tuning voltages for various tuning circuits of a second receiver 106 are stored. The tuning voltages of the second receiver 106 are provided via outputs 107 of the memory elements 100 and 102 for the further processing thereof in subsequent filter circuits.

Under the limiting or boundary condition that the same circuit components are used in the resonance circuits of the voltage controlled oscillators 20 and 38 as in the tuning circuits, a temperature compensation is ensured when the components are arranged in spatial proximity to each other, i.e. so that they are respectively exposed to the same surrounding environmental temperature, because the voltage controlled oscillator 20 or 38 is automatically tuned or compensated respectively by the first or second phase locked loop 12 or 14.

Figure 6:
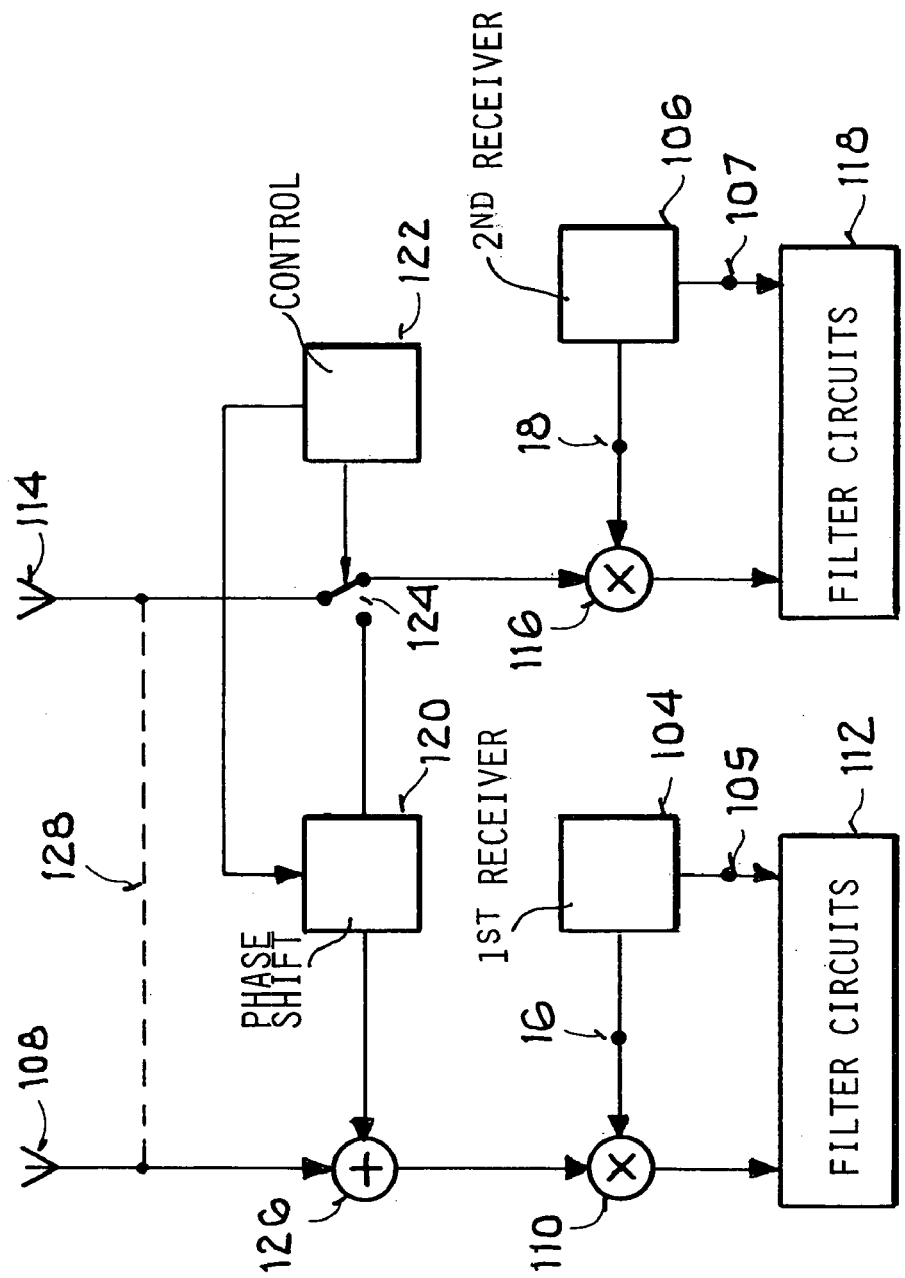
FIG. 6 is a simplified block diagram of an example embodiment with plural heterodyne receivers and plural antennas.

FIG. 6 schematically represents an example embodiment of an antenna diversity arrangement, further in connection with a circuit arrangement including the first and second receivers 104 and 106 according to FIG. 5, for example. The signal received by a first antenna 108, if applicable after being amplified through an amplifier with a low noise component (not shown), is provided to a mixer 110, to which the signal of the first output 16 of the first phase locked loop 12 of the first heterodyne receiver 104 is also provided. The output signal of the mixer 110 thus represents a reception signal that has been mixed down to an intermediate frequency, whereupon this mixed-down reception signal will be further processed in subsequent filter circuits or stages 112. For this purpose, the suitable tuning voltages are provided from the memories 96 and 98 to the subsequent filter circuits 112 via the outputs 105 of the first phase locked loop 12 i.e. of the first receiver 104.

Analogously, the signal received by a second antenna 114, if applicable after an amplification through an amplifier with a low noise component (not shown), is provided to a mixer 116, to which the output signal of the second output 18 of the second phase locked loop 14 of the second heterodyne receiver 106 is also provided. The output signal of the mixer 116, which represents the reception signal mixed-down to an intermediate frequency, is then provided to subsequent filter circuits 118 for further processing. For this purpose, the suitable tuning voltages are provided to the subsequent filter circuits 118 from the memories 100 and 102 through outputs 107 of the second phase locked loop 14 i.e. of the second receiver 106.

Furthermore, circuit elements for setting or adjusting a controllable phase shift between the respective reception signals received via the antennas 108 and 114 can additionally be provided. For this purpose in FIG. 6, a controllable phase shifter 120 is circuit-connected into the high frequency portion of the receiver arrangement, whereby this phase shifter 120 is controlled by a controller 122. Furthermore, the controller 122 actuates a double-throw switch 124, which selectively connects and directs the signal received by the second antenna 114 either to the mixer 116 as described above or to the phase shifter 120. The output signal of the phase shifter 120 is then provided to a further additive mixer 126, in which the output signal of the phase shifter 120 is additively combined with the signal received by the first antenna 108.

Through such a superposition or heterodyning of phase-shifted signals, it is possible to achieve a directional effect of the reception antenna arrangement according to the so-called phased array principle. It should be understood that the phase shifting and superposition can be carried out not only on the high frequency plane or level upstream of the mixers, but rather also on the intermediate frequency plane or level downstream of the mixers.

Similarly, for example, a controlled non-zero phase shifting can also be achieved by the phase synchronizer 58, which achieves a phase shift of zero in FIG. 4 as described above, but of course is not limited to this singular value (zero). In other words, the phase synchronizer 58, instead of achieving a synchronization with a zero phase shift or offset, could instead achieve a synchronization with any desired phase angle shift or offset other than zero.

As a further alternative deviating from the illustration of FIG. 6, a circuit arrangement having only a single antenna 108 could have first and second heterodyne receivers 104 and 106 allocated to this single antenna 108, for example as a combination of an audio receiver 104 and a background receiver 106 in the manner discussed above. In such a case, the second antenna 114 of FIG. 6 would be omitted, and instead replaced by the dashed cross-connection line 128.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of generating frequencies comprising:
   a) providing a common reference frequency to both a first phase locked loop and a second phase locked loop;
   b) generating a first oscillator frequency with said first phase locked loop;
   c) generating a second oscillator frequency with said second phase locked loop; and
   d) at least in one operating mode, feeding an attenuated signal from said first phase locked loop into said second phase locked loop, and carrying out said generating of said second oscillator frequency dependent on and responsive to said attenuated signal so that said second oscillator frequency matches said first oscillator frequency.

2. The method according to claim 1, further comprising, in another operating mode, carrying out said generating of said second oscillator frequency so that said second oscillator frequency differs from said first oscillator frequency.

3. The method according to claim 2, further comprising not feeding said attenuated signal from said first phase locked loop into said second phase locked loop in said another operating mode.

4. The method according to claim 3, wherein said not feeding of said attenuated signal comprises opening a switch to positively disconnect and discontinue said feeding of said attenuated signal.

5. The method according to claim 1, further comprising producing said attenuated signal by tapping or deriving a master signal from said first oscillator frequency and then attenuating said master signal to produce said attenuated signal, and wherein said feeding of said attenuated signal comprises providing said attenuated signal to an input of a voltage controlled oscillator of a said second phase locked loop that generates said second oscillator frequency.

6. The method according to claim 1, wherein said first phase locked loop includes a first frequency divider, said second phase locked loop includes a second frequency divider, and said method further comprises synchronizing said second frequency divider with said first frequency divider.

7. The method according to claim 1, wherein said second phase locked loop includes a frequency divider, and said method further comprises synchronizing said frequency divider with said reference frequency.

8. The method according to claim 1, further comprising superimposing said first oscillator frequency on a first reception frequency to thereby produce a first intermediate frequency, and superimposing said second oscillator frequency on a second reception frequency to thereby produce a second intermediate frequency.

9. A circuit arrangement for generating frequencies, comprising:
   a first phase locked loop adapted to produce a first oscillator frequency at a first output of said first phase locked loop;
   a second phase locked loop adapted to produce a second oscillator frequency at a second output of said second phase locked loop;
   a reference frequency emitter adapted to emit a reference frequency at a reference output of said emitter that is connected to a first reference input of said first phase locked loop and to a second reference input of said second phase locked loop; and
   an interconnection including a signal attenuator connected between said first phase locked loop and said second phase locked loop and adapted to feed an attenuated signal from said first phase locked loop to said second phase locked loop;
   wherein said second phase locked loop is adapted to produce said second oscillator frequency matching said first oscillator frequency based on said attenuated signal in one operating mode.

10. The circuit arrangement according to claim 9, wherein said second phase locked loop is adapted to produce said second oscillator frequency different from said first oscillator frequency in another operating mode.

11. The circuit arrangement according to claim 9, wherein said interconnection further includes a controllable switch connected in series with said signal attenuator and adapted to selectively complete and interrupt said interconnection so as to selectively enable and disable the feeding of said attenuated signal to said second phase locked loop.

12. The circuit arrangement according to claim 9, wherein said first phase locked loop includes a first voltage controlled oscillator having a master signal output, said second phase locked loop includes a second voltage controlled oscillator having a master signal input, and said interconnection is connected between said master signal output and said master signal input.

13. The circuit arrangement according to claim 12, wherein said first voltage controlled oscillator further has a first oscillator output that is distinct from said master signal output and that is connected to said first output of said first phase locked loop, and said second voltage controlled oscillator further has a second oscillator output that is connected to said second output of said second phase locked loop.

14. The circuit arrangement according to claim 12, wherein said first voltage controlled oscillator has a first main oscillator output connected to said first output of said first phase locked loop, said master signal output corresponds to, is connected to, or is derived from said first main oscillator output, and said second voltage controlled oscillator further has a second main oscillator output that is connected to said second output of said second phase locked loop.

15. The circuit arrangement according to claim 12, wherein said second voltage controlled oscillator further has a loop control signal input that is distinct from said master signal input and that is connected in said second phase locked loop.

16. The circuit arrangement according to claim 9, a wherein said signal attenuator is an ohmic resistor.

17. The circuit arrangement according to claim 9, wherein said first phase locked loop includes a first frequency divider, said second phase locked loop includes a second frequency divider, and said circuit arrangement further comprises a phase synchronizer that is connected between an output of said first frequency divider and a synchronizing input of said second frequency divider and that is adapted to synchronize said second frequency divider with said first frequency divider.

18. The circuit arrangement according to claim 9, wherein said second phase locked loop includes a frequency divider, and said circuit arrangement further comprises a phase synchronizer that is connected between said reference output of said reference frequency emitter and a synchronizing input of said frequency divider and that is adapted to synchronize said frequency divider with said reference frequency.

19. The circuit arrangement according to claim 9, further comprising:
a first heterodyne receiver incorporating said first phase locked loop therein;
a second heterodyne receiver incorporating said second phase locked loop therein;
a first signal reception input adapted to receive a first reception frequency;
a second signal reception input adapted to receive a second reception frequency;
a first mixer that has a first input connected to said first signal reception input and a second input connected to said first output of said first phase locked loop of said first heterodyne receiver, and that is adapted to superimpose said first oscillator frequency on said first reception frequency to form a first intermediate frequency; and
a second mixer that has a first input connected to said second signal reception input and a second input connected to said second output of said second phase locked loop of said second heterodyne receiver, and that is adapted to superimpose said second oscillator frequency on said second reception frequency to form a second intermediate frequency.

20. The circuit arrangement according to claim 19, further comprising a first antenna connected to said first signal reception input, and a second antenna that is separate from said first antenna and connected to said second signal reception input, wherein said first and second heterodyne receivers are respectively coupled via said first and second mixers to said separate first and second antennas.

21. The circuit arrangement according to claim 20, further comprising a cross-connection including a third mixer connected between said first and second signal reception inputs.

22. The circuit arrangement according to claim 21, wherein said third mixer is interposed between said first signal reception input and said first mixer, in that said third mixer has a first input connected to said first signal reception input, a second input connected to said second signal reception input, and an output connected to said first input of said first mixer.

23. The circuit arrangement according to claim 22, wherein said cross-connection further includes a controllable phase shifter interposed between said second signal reception input and said second input of said third mixer.

24. The circuit arrangement according to claim 22, wherein said cross-connection further includes a controllable switch interposed between said third mixer, said second signal reception input and said first input of said second mixer, in that said controllable switch has a switch input connected to said second signal reception input, a first switch output connected to said second input of said third mixer, and a second switch output connected to said first input of said second mixer, and said controllable switch is adapted to selectively connect said switch input to said first switch output or said second switch output as selected.

25. The circuit arrangement according to claim 19, further comprising a third heterodyne receiver and a further mixer that superimposes a third oscillator frequency of said third heterodyne receiver on a third reception frequency to form a third intermediate frequency in a first operating mode, and that is operated with said first oscillator frequency in a second operating mode.

26. The circuit arrangement according to claim 19, further comprising only a single antenna connected to said first signal reception input, no antenna connected to said second signal reception input, and a circuit connection between said first and second signal reception inputs.

27. A mobile radio receiver apparatus comprising the circuit arrangement according to claim 9, and further comprising at least one antenna and at least one mixer connected to said circuit arrangement.

* * * * *